United States Patent [19]

Uchida

[11] 4,093,963

[45] June 6, 1978

[54] HORIZONTAL AFC CIRCUIT IN A TELEVISION RECEIVER USABLE WITH A VIDEO SIGNAL RECORDING AND REPRODUCING APPARATUS

[75] Inventor: Tomoaki Uchida, Iwai, Japan

[73] Assignee: Victor Company of Japan Ltd., Yokohama, Japan

[21] Appl. No.: 694,795

[22] Filed: Jun. 10, 1976

[30] Foreign Application Priority Data

Jun. 19, 1975 Japan ................................ 50-73781

[51] Int. Cl.$^2$ ....................... H04N 5/04; H03K 5/20; H03F 3/68

[52] U.S. Cl. .................................. 358/158; 358/159; 307/232; 331/20

[58] Field of Search ................ 358/158, 159; 307/232, 307/235 T; 331/20

[56] References Cited

U.S. PATENT DOCUMENTS

| | | | |
|---|---|---|---|
| 3,846,584 | 11/1974 | Itoh et al. | 358/158 |
| 3,863,080 | 1/1975 | Steckler | 358/159 X |

Primary Examiner—John C. Martin
Assistant Examiner—Aristotelis M. Psitos
Attorney, Agent, or Firm—Haseltine, Lake & Waters

[57] ABSTRACT

A horizontal AFC circuit comprising a phase detector circuit supplied with a horizontal synchronizing signal separated from a television video signal and with a comparison signal and carrying out phase comparison, a filter circuit for filtering the output of the phase detector circuit, a horizontal oscillator circuit supplied with the output of the filter circuit and oscillating with an oscillation frequency controlled thereby, a horizontal deflection circuit for forming the output signal of the horizontal oscillator circuit into a horizontal deflection pulse, a wave shaping circuit operating upon being supplied with the output pulse of the horizontal deflection circuit to wave shape this output pulse and to supply the resulting output signal thereof as said comparison signal to the phase detector circuit, means for supplying a control pulse of a pulse width corresponding to a vertical blanking period of the television video signal, and loop gain control means supplied with the control pulse and operating to cause the loop gain of the horizontal AFC circuit to be relatively large in the pulse width duration and to cause the loop gain to be relatively small in a period other than said pulse width duration.

3 Claims, 10 Drawing Figures

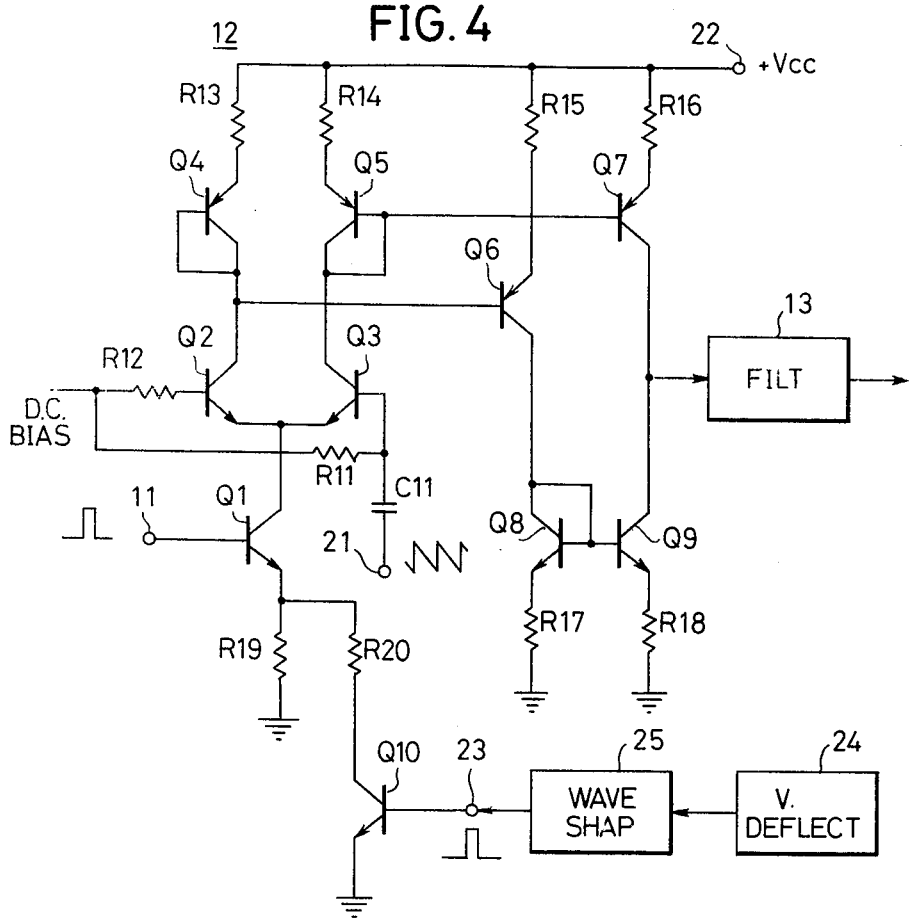
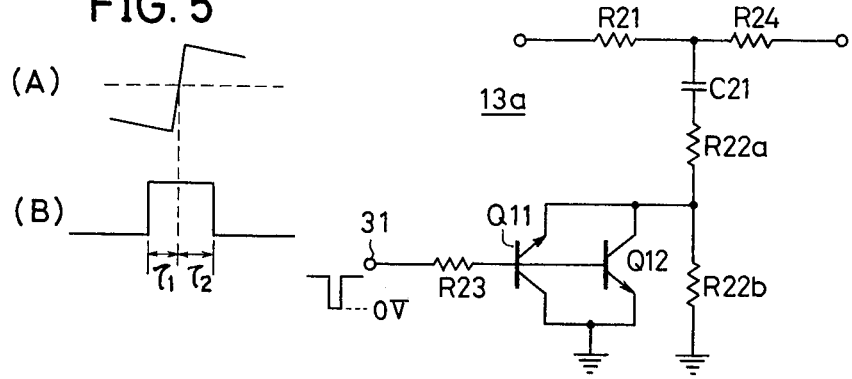

HORIZONTAL AFC CIRCUIT IN A TELEVISION RECEIVER USABLE WITH A VIDEO SIGNAL RECORDING AND REPRODUCING APPARATUS

BACKGROUND OF THE INVENTION

The present invention relates generally to horizontal AFC circuits (horizontal automatic frequency control circuits), and more particularly to a horizontal AFC circuit in a television receiver for receiving a reproduced video signal from an apparatus for magnetically recording and reproducing a video signal.

In general, there is a video signal magnetic recording and reproducing apparatus of a type which records and reproduces video signals on and from slant tracks on a magnetic tape for each field alternately by means of two rotating magnetic heads, for example. In a video signal magnetic recording and reproducing apparatus of this type, the reproduced video signals from the rotating heads are switched with vertical periods and are led out as a continuous series of reproduced video signals.

In this video signal magnetic recording and reproducing apparatus, however, if there is an occurrence such as timing lag of the switching time instants of the output signals of the two heads or stretching or contraction of the magnetic tape, phase lag will occur in the series of signals at the signal switching instant, whereby skew distortion will develop in the reproduced picture of the television receiver. The phase lag in that event develops in the manner of a step function.

When a phase lag of a step function occurs in this manner in a reproduced signal supplied to a television receiver, a transient response develops in the phase characteristic of the television receiver. In order to reduce the effect of the distortion in the reproduced picture which accompanies this phase lag, it is necessary to shorten the time of the above mentioned transient response. This transient response may be shortened by increasing the AC loop gain of the horizontal AFC circuit of the television receiver.

However, when the AC loop gain is made large, the passing quantity of the high-frequency band component of the filter provided in the horizontal AFC circuit increases. For this reason, the degree to which the horizontal AFC circuit system is disturbed by the noise component becomes large. Especially in the case of reception of television broadcasting waves in an area of weak electric field, the disorder in the horizontal direction of the reproduced picture becomes large. Consequently, it is difficult, in principle, to attain simultaneously both shortening of the transient response time and improvement of the noise characteristic.

Accordingly, in a horizontal AFC circuit of the prior art, an AC loop gain changeover switch is provided. By operating this switch, the AC loop gain is caused to be of relatively low value in order to improve the noise characteristic in the case of reception of television broadcast waves since the skew distortion is small in this case. In the case where a signal reproduced from a video signal magnetic recording and reproducing apparatus is reproduced into a picture, the switch is operated to cause the AC loop gain to be a relatively large value in order to shorten the transient response time since the skew distortion is large in this case.

However, in either case, improvement of both the transient response characteristic and the noise suppression characteristic cannot be achieved, and in either mode of picture reproduction, one of these two characteristics is unavoidably sacrificed. In this known horizontal AFC circuit, furthermore, it has been necessary to carry out troublesome manipulation of the above mentioned changeover switch in accordance with the mode of picture reproduction.

SUMMARY OF THE INVENTION

Accordingly, it is a general object of the invention to provide a novel and useful horizontal AFC circuit in which the above described problems in the prior art have been overcome.

Another and more specific object of the invention is to provide a horizontal AFC circuit adapted to carry out an operation wherein the AC loop gain is substantially made relatively large only in the vertical blanking period within a video signal (composite video signal) and is made relatively small in other video information signal period. In the horizontal AFC circuit according to the invention, the transient response time of the phase lag in the vertical blanking period is short, and, even when there is a phase lag at the switching point of the reproduced signals from a video signal magnetic recording and reproducing apparatus, there is substantially almost no occurrence of picture bending in the reproduced picture. Furthermore, in the video information signal period, the noise characteristic is good, and a good picture which is almost completely free of the effect of noise is obtained.

Still another object of the invention is to provide a horizontal AFC circuit in which, through the use of the output of a vertical deflection circuit or a vertical oscillation circuit, the AC loop gain is automatically made relatively large only in the vertical blanking period in the video signal.

Other objects and further features of the invention will be apparent from the following detailed description with respect to preferred embodiments of the invention when read in conjunction with the accompanying drawings.

BRIEF DESCRIPTION OF THE DRAWINGS

In the drawings:

FIG. 4 is a specific circuit diagram in concrete form, partly in block diagram form, showing one example of a phase detector constituting an essential part of a first embodiment of the horizontal AFC circuit according to the invention;

FIGS. 5(A) and 5(B) are graphical time charts respectively showing the waveforms of a sawtooth wave signal and a horizontal synchronizing signal supplied to the circuit illustrated in FIG. 4;

FIGS. 6 and 7 are circuit diagrams respectively showing examples of a filter circuit constituting an essential part of a second embodiment of the horizontal AFC circuit according to the invention;

DETAILED DESCRIPTION

Figure 1:
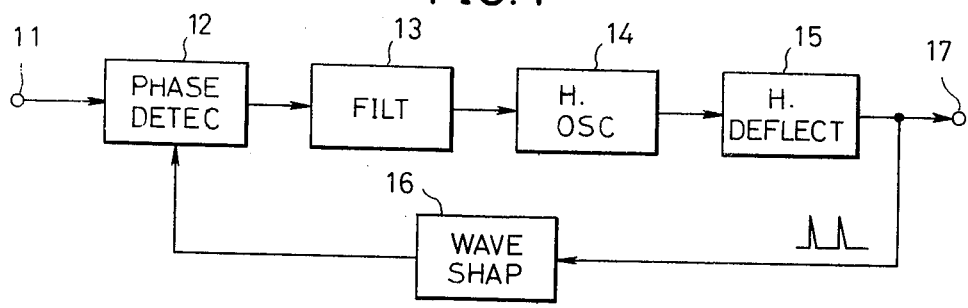
FIG. 1 is a block system diagram of one example of a horizontal AFC circuit to which the present invention can be applied.

FIG. 1 illustrates one example of a horizontal AFC circuit of a television receiver of general type to which the present invention can be applied. A horizontal synchronizing signal which has been separated from a reproduced video signal enters the circuit through an input terminal 11 and is supplied to a phase detector 12. Here, the difference in the phase of the horizontal synchronizing signal and of a comparison signal from a wave shaping circuit 16 described hereinafter is detected. A signal of a level corresponding to this phase difference is led out of the phase detector 12. This phase difference signal is supplied through a filter circuit 13 of voltage transmission type or current transmission type to a horizontal oscillator circuit 14 and controls the output oscillation frequency thereof. The output signal of the horizontal oscillator circuit 14 is supplied to a horizontal deflection output circuit 15. The horizontal deflection pulse produced as output by this circuit 15 is led out through a terminal 17 and, at the same time, is fed to the above mentioned wave shaping circuit 16. The horizontal deflection pulse is wave formed by the wave shaping circuit 16 and is supplied as a comparison signal to the phase detector 12.

As is known, the oscillation of the horizontal oscillator circuit 14 is controlled by the circuit of the above described organization in a manner such that phases of the input horizontal synchronizing signal and of the comparison signal obtained from the horizontal deflection pulse will coincide. In this manner the horizontal synchronization of the reproduced picture is stably maintained.

Figure 2:
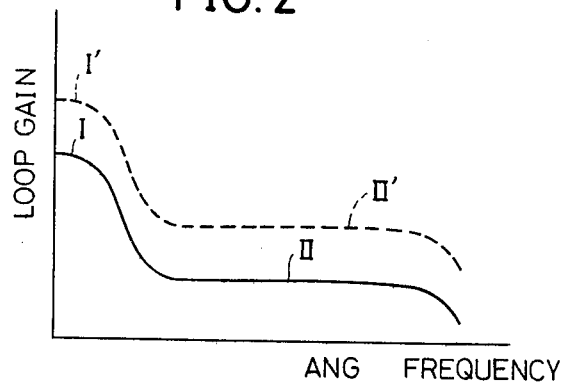
FIG. 2 is a graph indicating AC loop gain and DC loop gain characteristics.

In the above described horizontal AFC circuit, the quantity of variation of the oscillation frequency of the horizontal oscillator circuit 14 per radian of phase lag between the horizontal synchronizing signal and the output horizontal deflection pulse is generally called the loop gain. In the case where a filter circuit of voltage transmission type or current transmission type is used for the filter circuit 13, the frequency characteristic of the loop gain is as indicated in FIG. 2. In FIG. 2, the ordinate represents loop gain, and the abscissa represents angular frequency. The loop gain characteristic for a direct-current signal of the output of the phase detector 12 becomes as indicated by the DC loop gain of the curve part I in FIG. 2. The loop gain characteristic for an alternating-current signal of the output of the phase detector 12 is as indicated by the AC loop gain of the curve part II.

Figure 3:
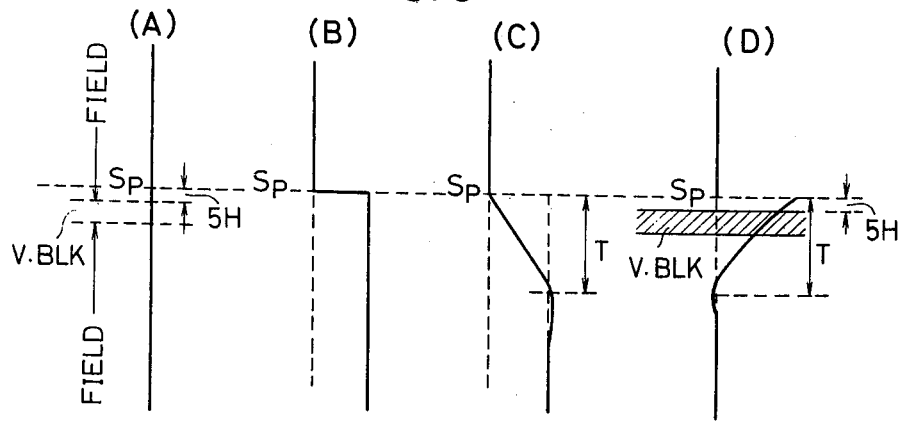
FIGS. 3(A), 3(B), 3(C), and 3(D) are graphs respectively for descriptions of a switching time instant of reproduced signals of a video signal magnetic recording and reproducing apparatus, a phase lag characteristic, a transient response characteristic of a television receiver accompanying signal phase lag, and picture bending on a reproduced picture screen.

In a video signal magnetic recording and reproducing apparatus, in general, the reproduced video signals from respective rotating magnetic heads are switched at a time instant or point Sp which is approximately five horizontal scanning periods (5H) in front of a vertical blanking period V.BLK as indicated in FIG. 3(A). In FIGS. 3(A) through 3(D), the ordinate represents a time axis and corresponds to the direction of advancing of the field. In general, as a consequence of causes such as timing lag of the switching time point and stretching and contraction of the magnetic tape, phase lag occurs at the signal switching point, and the phase characteristic thereof varies in a step function at the signal switching point Sp as indicated in FIG. 3(B). The following description is set forth with respect to the case where the phase is delayed at the signal switching point Sp. The case wherein the phase is advanced is similar, the waveforms in FIG. 3(B), 3(C), and 3(D) merely becoming symmetrical left and right with respect to the time axis.

In the horizontal AFC circuit of the television receiver which has been supplied with a signal of the phase characteristic indicated in FIG. 3(B), a transient response of the signal occurs as indicated in FIG. 3(C). Furthermore, on the reproduced picture screen of the receiver, the picture suddenly bends in the lateral or horizontal direction at the above mentioned switching point Sp near the end of one field as indicated in FIG. 3(D), that is, at the lower part of the picture screen, and this bending continues also in the initial part of the next field succeeding to the blanking period, that is, the upper part of the picture screen. The period T of bending of the picture screen indicated in FIG. 3(D) corresponds to the transient response time T indicated in FIG. 3(C).

With respect to the above mentioned bending of the picture, screen, since the lowermost part of the picture is almost invisible on an actual picture screen, this bending poses almost no problem in actual practice. Furthermore, within the vertical blanking period V.BLK, the picture does not appear on the picture screen, and, for this reason, this bending does not give rise to any problems. However, bending of the picture appears at the upper part of the picture screen of the succeeding field, and the picture screen becomes disturbed. The longer is the above mentioned transient response time T, the larger is the part of the picture screen in which the bending of the picture occurs. Accordingly, the part of the upper part of the picture screen in which picture bending occurs can be reduced by shortening the transient response time T.

The expedient of increasing the aforementioned AC loop gain in order to shorten this transient response time T can be considered. However, merely increasing the AC loop gain will result in an increase in the quantity of the high-frequency component passing through the filter circuit 13, whereby the degree of disturbance of the horizontal AFC circuit by the noise component becomes great. Therefore, as mentioned hereinbefore, it is difficult in principle to achieve simultaneously both a shortening of the transient response time and an improvement in the noise characteristic.

The present invention contemplates overcoming the above described problem. More specifically, in accordance with the invention, the AC loop gain is automatically caused to be large only in the vertical blanking period as described below. For this reason, since the AC loop gain becomes large in the vertical blanking period, the transient response time of the phase lag accompanying the switching of the reproduced signals of the video signal magnetic recording and reproducing apparatus can be shortened. Therefore, the bending of the picture at the upper part of the reproduced picture screen of the succeeding field can be greatly decreased. In this connection, the noise characteristic during the vertical blanking period at this time becomes poor, but since the vertical blanking period does not appear on the reproduced picture screen even if there is noise, there is no deleterious effect due to noise in actual practice. Since the AC loop gain is made small in the video information signal periods other than the vertical blanking period, the noise characteristic is good, and a good picture without any effect of noise is obtained.

The AC loop gain may be increased by directly causing it to increase. Furthermore, since the AC loop gain increases as a result of an increase in the DC loop gain as indicated by curves I' and II' in FIG. 2, the DC loop gain may be caused to increase in order to increase the AC loop gain. In the first embodiment of the invention described hereinbelow, the AC loop gain is increased by increasing the DC loop gain.

The circuit of one example of the phase detector 12 constituting an essential part of a first embodiment of the horizontal AFC circuit of the invention is shown in FIG. 4. The parts in this horizontal AFC circuit of the invention other than the phase detector are the same as those of the block system illustrated in FIG. 1 and are constituted by known circuits.

A horizontal synchronizing signal through the input terminal 11 is applied to the base of a transistor Q1, which is thereupon placed in its operative state. On one hand, a comparison signal of sawtooth waveform resulting from the wave shaping of a horizontal deflection pulse by the wave shaping circuit 16 is applied to a terminal 21. This comparison signal is applied by way of a capacitor C11 to the base of an NPN transistor Q3 and, at the same time, further by way of resistors R11 and R12 to the base of an NPN transistor Q2. The transistors Q2 and Q3 constitute a differential amplifier. The average voltage of the comparison signal becomes a DC bias voltage applied to the junction between the resistors R11 and R12.

Here, it is assumed that the comparison waveform signal indicated in FIG. 5(A) and the horizontal synchronizing signal indicated in FIG. 5(B) have a phase relationship as indicated in the figures. Furthermore, for the sake of simplifying the description, it will be assumed that the resistance values respectively of resistors R13, R14, R15, and R16 are equal, and that the resistance values respectively of resistors R17 and R18 are also equal.

As indicated in FIGS. 5(A) and 5(B), in the period $\tau 1$ wherein the horizontal synchronizing signal exists and the comparison signal is negative, the transistors Q1 and Q2 are in their operative states, and a PNP transistor Q4 connected between the collector of the transistor Q2 and a direct-current power source terminal 22 operates. On the other hand, the transistor Q3 and a PNP transistor Q5 connected between the collector of the transistor Q3 and the terminal 22 are in their inoperative states.

Consequently, the collector output of the transistor Q2 is applied to the base of a PNP transistor Q6, which thereupon operates, while the collector output of the transistor Q3 is not applied to the base of a PNP transistor Q7, which therefore is in its inoperative state. As a result of the operation of the transistor Q6, NPN transistors Q8 and Q9 operate, and a current substantially equal to the collector current of the transistor Q1 flows from the filter circuit 13 toward the collector side of the transistor Q9.

Then, in a period $\tau 2$ wherein the horizontal synchronizing signal is present and the comparison signal is positive as indicated in FIGS. 5(A) and 5(B), the transistors Q1 and Q3 are in their respective operative states, and the transistor Q5 operates, whereby the transistor Q7 operates. At this time, the transistor Q6 does not operate, whereby the transistors Q8 and Q9 do not operate. For this reason, a current substantially equal to the collector current of the transistor Q1 flows out of the collector of the transistor Q7 to the filter circuit 13.

The above mentioned periods $\tau 2$ vary in accordance with the phase difference of the comparison signal and the horizontal synchronizing signal, whereby the flowing-in and flowing-out periods of the currents flowing into and flowing out of the filter circuit 13 vary. As a consequence of this variation, the average DC level of the output of the filter circuit 13 varies, and phase detection is accomplished.

On one hand, the DC loop gain of the AFC system has a proportional relationship to the collector current of the transistor Q1. Accordingly, in the circuit of the present invention, the vertical deflection pulse from a vertical deflection circuit 24 is formed to have a positive polarity by a wave shaping circuit 25, and the resulting output pulse is applied to an input terminal 23. This pulse which has been introduced through the input terminal 23 is applied to the base of a transistor Q10, which thereupon is rendered operative. Consequently, the transistor Q10 assumes its conductive state only in this period during which the above mentioned pulse is entering the circuit, that is, the vertical blanking period.

When the transistor Q10 becomes conductive, the value of the emitter resistance of the transistor Q1 becomes the resistance value of the parallel resistance of a resistor R19 and a resistor 20, and the resistance value becomes less than that in the case wherein the transistor Q10 is nonconductive and only the resistor 19 constitutes the emitter resistance. For this reason, the collector current of the transistor Q1 increases, and the DC loop gain increases as indicated by curve I' in FIG. 2. As a result, the AC loop gain also increases as indicated by curve II' in FIG. 2 responsive to the increase in the DC loop gain only during the vertical blanking period, and the transient response time of the phase lag in this vertical blanking period is shortened.

In the period during which the pulse is not applied to the input terminal 23, that is, the time period other than the vertical blanking period, the transistor Q10 becomes nonconductive, and the emitter resistance of the transistor Q1 becomes only the resistance value of the resistor R19. The emitter resistance thereby becomes greater than that in the case of parallel resistance of the resistors R19 and R20, and the collector current to the transistor Q1 decreases. As a consequence, the DC loop gain decreases as indicated by curve I in FIG. 2. For this reason, in the video information signal period other than the vertical blanking period, the AC loop gain also decreases as a result as indicated by curve II in FIG. 2, and the noise resistance characteristic improves.

The pulse to be applied to the input terminal 23 need not be limited to a pulse obtained as in the above described embodiment of the invention but may be any pulse having a cyclic period and a pulse width corresponding to the vertical blanking period, examples of suitable pulses being the output pulse of the vertical oscillator circuit, a pulse obtained by wave forming this output pulse, or a pulse obtained from the vertical synchronizing signal and wave formed to a specific pulse width.

Next, examples of the filter circuit 13 constituting an essential part of a second embodiment of the horizontal AFC circuit of the invention will now be described with reference to FIGS. 6 and 7. In this horizontal AFC circuit of the invention, the parts thereof other than the filter circuit are the same as those in the circuit shown by block diagram in FIG. 1 and can be constituted by known circuits.

In a filter circuits 13a shown in FIG. 6 as the first example of the filter circuit 13 according to the invention, a pulse of negative polarity and a pulse width corresponding to the vertical blanking period is applied to a terminal 31. This pulse introduced through the terminal 31 is applied through a resistor R23 to the bases of transistors Q11 and Q12. Normally, with a positive voltage applied to their bases, these transistors Q11 and Q12 are in their conductive states, and the opposite terminals of a resistor R22b are short-circuited. The relationship between the AC loop gain and the DC loop gain in this case becomes as follows.

$$\frac{\text{AC loop gain}}{\text{DC loop gain}} = \frac{R22a}{R21 + R22a}$$

The AC loop gain assumes a relatively small specific value as indicated by curve II in FIG. 2. Therefore, picture reproduction is accomplished with good noise characteristic in the video information signal period.

Next, when the operation enters the vertical blanking period, a negative pulse of a pulse width corresponding to this period is applied to the terminal 31, whereby the transistors Q11 and Q12 become nonconductive. For this reason, the resistor R22b becomes connected in series with the resistor R22a in effect, whereby the combined impedance of the resistors R22a and R22b becomes large, and the AC loop gain becomes large. Therefore, the transient response time of the phase lag within the vertical blanking period becomes small.

Figure 7:
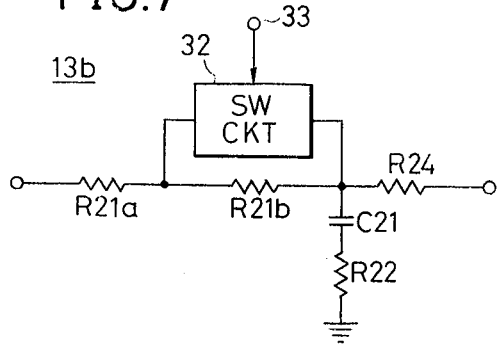

The filter circuit 13b as the second example of the filter circuit 13 according to the invention is illustrated in FIG. 7. In this filter circuit, there is provided a switching circuit 32 which comprises transistors similarly as in the example illustrated in FIG. 6 and is connected in parallel with a resistor R21b. A pulse of positive polarity and having a pulse width corresponding to the vertical blanking period is applied through a terminal 33 to this switching circuit 32. During period other than the vertical blanking period, the switching circuit 32 is nonconductive, whereby a resistor R21a is in a state of being connected in series with the resistor R21b, and the AC loop gain is small. In the vertical blanking period, the switching circuit 32 becomes conductive, and the ends of a resistor R21b are short-circuited. The combined resistance of the resistors R21a and R21b becomes small, and the AC loop gain becomes large.

Figure 8:
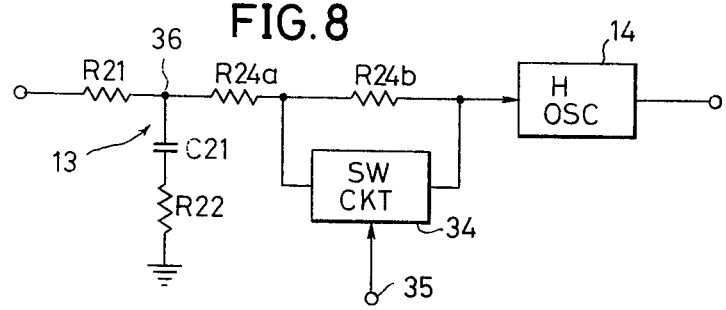
FIG. 8 is a circuit diagram showing one example of a connection part between a filter circuit and a horizontal oscillator circuit constituting essential parts of a third embodiment of the horizontal AFC circuit according to the invention.

The circuit of one example of the connection part between the filter circuit 13 and the horizontal oscillator circuit 14 constituting essential parts of a third embodiment of the horizontal AFC circuit of the invention is illustrated in FIG. 8. Other constituent parts of the circuit are the same as in the prior art. A signal which has passed through the filter circuit 13 comprising resistors R21 and R22 and a capacitor C21 is supplied through resistors R24a and R24b to the horizontal oscillator circuit 14. A switching circuit 34 is connected in parallel with the resistor R24, and a pulse of a width corresponding to the vertical blanking period is applied through a terminal 35 to this switching circuit 34.

The switching circuit 34 is rendered conductive by the pulse supplied through the terminal 35 to short-circuit the resistor R24b. As a consequence, the combined impedance of the resistors R24 and R24b becomes small relative to the input impedance of the horizontal oscillator circuit 14. Therefore, the proportion (control sensitivity) of the quantity of oscillation frequency variation of the horizontal oscillation circuit 14 with respect to the unit variation quantity at a point 36 of the signal which has passed through the filter circuit 13 becomes large, and, as an effective result, the AC loop gain becomes large.

Next, examples of the wave shaping circuit 16 constituting an essential part of a third embodiment of the horizontal AFC circuit of the invention will be described. Other constituent parts of the circuit are the same as in the prior art.

Figure 9:
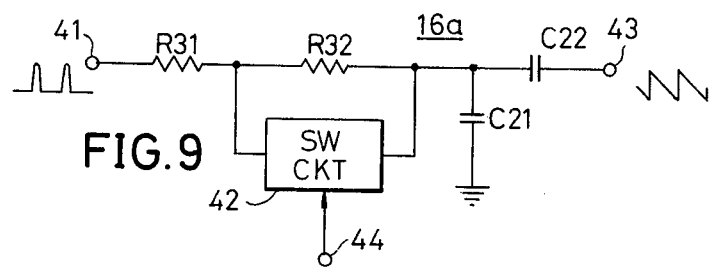
FIGS. 9 and 10 are circuit diagrams respectively illustrating examples of a wave shaping circuit constituting an essential part of a fourth embodiment of the horizontal AFC circuit according to the invention.

In the first example of the wave shaping circuit 16a shown in FIG. 9, the output signal of the horizontal deflection circuit 15 is applied to a terminal 41. This wave shaping circuit 16a comprises resistors R31 and R32, capacitors C21 and C22, and a switching circuit 42. The signal applied to the terminal 41 is wave shaped into a sawtooth waveform in accordance with the charging and discharging of the capacitor C21 and is supplied as a comparison signal through a terminal 43 to the phase detector 12.

The switching circuit 42 is connected in parallel with the resistor R32 and is controlled in ON-OFF operation by a pulse of a width equal to the vertical blanking period applied to a terminal 44. At times when no pulse is being applied thereto, the switching circuit 42 is in "OFF" state, whereby the resistor R32 is not short-circuited, and the time constant of charging and discharging of the capacitor C21 determined by the resistance values of the resistors R31 and R32 and the capacitance value of the capacitor C21 is large. Consequently, the amplitude of the sawtooth wave led out through the terminal 43 is small, whereby the loop gain is small.

On the other hand, the switching circuit 42 becomes "ON" during the width period of the applied pulse, and the terminals of the resistor R32 are short-circuited. As a consequence, the charging and discharging time constant of the capacitor C21 becomes small, and the amplitude of the sawtooth wave led out through the terminal 43 becomes large. Therefore, the loop gain becomes large.

Figure 10:
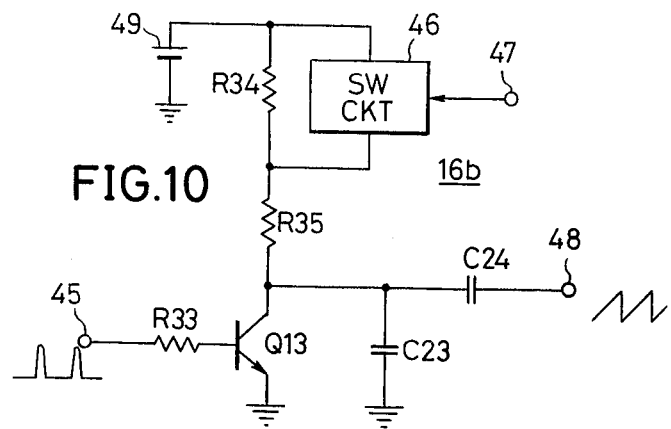

The circuit 16b of a second example of the wave shaping circuit is illustrated in FIG. 10. The output signal of the horizontal deflection circuit 15 introduced through a terminal 45 is applied through a resistor R33 to the base of a transistor Q13. The emitter of this transistor Q13 is grounded (earthed), and between its collector and a bias power source 49, resistors R34 and R35 are connected. A switching circuit 46 to which a pulse of a width equal to the vertical blanking period is applied through a terminal 47 is connected in parallel with the resistor 34.

At a time when a pulse is not being applied thereto, the switching circuit 46 is in its "OFF" state, and the charging time constant of the capacitor C23 determined by the resistance values of the resistors R34 and R35 and the capacitance value of a capacitor C23 is large. Consequently, the amplitude of the sawtooth wave led out through a capacitor C24 and a terminal 48 and supplied to the phase detector 12 is small, and the loop gain is small. On the other hand, the switching circuit 46 assumes its "ON" state in the width period of the pulse applied thereto, and the terminals of the resistor 34 are short-circuited. As a consequence, the charging time constant of the capacitor C23 becomes small, and the amplitude of the sawtooth wave led out of the terminal 48 becomes large. Therefore, the loop gain becomes large.

While, in each of the above described embodiments of the invention, the switching circuit is connected in parallel respectively with the resistors R22b, R21b, R24b, R32, and R35, it is also possible to connect the above named resistors R22b, R21b, R24b, R32 and R34 in parallel respectively with the resistors R22a, R21a, R24a, R31, and R35 and to connect the switching circuit in series with the resistors R22b, R21b, R24b, R32, and R34. In this case, the polarity of the control pulse to be applied to the switching circuits is so selected that the same loop gain control operation in effect as that described above can be achieved.

Further, this invention is not limited to these embodiments but various variations and modifications may be made without departing from the scope and spirit of the invention.

What is claimed is:

1. A horizontal AFC circuit comprising:
phase detector means supplied with a horizontal synchronizing signal separated from a television video signal and with a comparison signal and carrying out phase comparison, said phase detector means having a transistor supplied at the base thereof with the horizontal synchronizing signal;
filter means for filtering the output of said phase detector means;
horizontal oscillator means supplied with the output of said filter means for oscillating with an oscillation frequency controlled thereby;
horizontal deflection means for forming the output signal of said oscillator means into a horizontal deflection pulse;
wave shaping circuit means responsive to the output pulse of said horizontal deflection means for wave-shaping said output pulse and for supplying the resulting output signal thereof as said comparison signal to said phase detector means;
means for supplying a control pulse having a pulse width corresponding to a vertical blanking period of the television video signal; and
loop gain control means connected to the emitter of said transistor of said phase detector means in a manner to vary the emitter resistance in accordance with said control pulse, the collector current of said transistor being varied by the resulting variation of the emitter resistance thereof, whereby a DC loop gain and an AC loop gain of the horizontal AFC circuit are simultaneously controlled to be relatively large during occurrence of said control pulse and to be relatively small in a period other than the occurrence of said control pulse.

2. A horizontal AFC circuit comprising:
phase detector means supplied with a horizontal synchronizing signal separated from a television video signal and with a comparison signal for carrying out phase comparison;
filter means for filtering the output of said phase detector means;
horizontal oscillator means supplied with the output of said filter means for oscillating with an oscillation frequency controlled thereby;
horizontal deflection means for forming the output signal of said horizontal oscillator means into a horizontal delection pulse;
wave shaping circuit means responsive to the output pulse of said horizontal delfection means for wave-shaping said output pulse and for supplying the resulting output signal thereof as said comparison signal to said phase detector means;
means for supplying a control pulse having a pulse width corresponding to a vertical blanking period of the television video signal; and
loop gain control means comprising a resistor connected between said filter means and said horizontal oscillator means and switching circuit means connected between the terminals of and in parallel with said resistor and assuming conductive and non-conductive states, in response to said control pulse, to carry out short-circuiting and non-short-circuiting of said resistor whereby a DC loop gain and an AC loop gain of the horizontal AFC circuit are simultaneously controlled to be relatively large during occurrence of said control pulse and to be relatively small in a period other than the occurrence of said control pulse.

3. A horizontal AFC circuit comprising:
phase detector means supplied with a horizontal synchronizing signal separated from a television video signal and with a comparison signal for carrying out phase comparison;
filter means for filtering the output of said phase detector means;
horizontal oscillator means supplied with the output of said filter means for oscillating with an oscillation frequency controlled thereby;
horizontal deflection means for forming the output signal of said horizontal oscillator means into a horizontal deflection pulse;
wave shaping circuit means comprising at least a capacitor for charging and discharging electric charge and a resistor for determining at least the charging time constant of said capacitor to form the horizontal deflection pulse supplied thereto into a sawtooth wave which is supplied as said comparison signal to said phase detector means;
means for supplying a control pulse having a pulse width corresponding to a vertical blanking period of the television video signal; and
loop gain control means responsive to said control pulse for varying the resistance value of said resistor of said wave shaping circuit means to control the amplitude of the sawtooth wave in accordance with said resistance value in a manner that a DC loop gain and an AC loop gain of the horizontal AFC circuit are relatively large during occurrence of said control pulse and are relatively small in a period other than the occurrence of said control pulse.

* * * * *